(12) United States Patent
Schaffer

(10) Patent No.: US 6,260,178 B1
(45) Date of Patent: Jul. 10, 2001

(54) COMPONENT PLACEMENT MACHINE STEP SIZE DETERMINATION FOR IMPROVED THROUGHPUT VIA AN EVOLUTIONARY ALGORITHM

(75) Inventor: J. David Schaffer, Wappingers Fall, NY (US)

(73) Assignee: Philips Electronics North America Corporation, New York, NY (US)

(*) Notice: Subject to any disclaimer, the term of this patent is extended or adjusted under 35 U.S.C. 154(b) by 0 days.

(21) Appl. No.: 09/277,636

(22) Filed: Mar. 26, 1999

(51) Int. Cl.$^7$ .................................................. G06F 17/50
(52) U.S. Cl. ..................................... 716/2; 716/8; 706/13
(58) Field of Search ................................ 716/2, 8; 706/13

(56) References Cited

U.S. PATENT DOCUMENTS 5,390,283 * 2/1995 Eshelman et al. ................... 706/13
5,909,674 * 6/1999 Schaffer et al. ...................... 706/13

FOREIGN PATENT DOCUMENTS 0 763 796 A2 * 10/1996 (EP) .
07022784A    7/1993 (JP) .
07141438A   11/1993 (JP) .
10209682A    1/1997 (JP) .
09216135A    8/1997 (JP) .

* cited by examiner

Primary Examiner—Matthew Smith
Assistant Examiner—Jibreel Speight
(74) Attorney, Agent, or Firm—Aaron Waxler

(57) ABSTRACT

The step size parameters of a component placement machine are represented as genes in a component placement chromosome, and evolutionary algorithm techniques are applied to evolve offspring that have step size parameters that provide an improved component placement throughput estimate. The offspring that have these preferential step size parameters are used to generate additional offspring that provide further improvement in the component placement throughput estimate. After a number of generations, the step size parameters of the offspring that provides the best component placement throughput are used to program the component placement machine to achieve this improved throughput.

11 Claims, 5 Drawing Sheets

COMPONENT PLACEMENT MACHINE STEP SIZE DETERMINATION FOR IMPROVED THROUGHPUT VIA AN EVOLUTIONARY ALGORITHM

BACKGROUND OF THE INVENTION

1. Field of the Invention

This invention relates to the field of automated assembly, and in particular to the field of printed circuit board component placement and assembly.

2. Description of Related Art

Printed circuit boards are typically assembled via the use of component placement machines, typically called "pick and place" machines. Electronic components are automatically placed on the printed circuit board by a placement machine and subsequently electrically attached to the board, using, for example, wave soldering techniques. Typically, the component placement machine comprises multiple component placement modules, so that multiple components can by placed on the printed circuit board at the same time. For mechanical efficiency, component placement machines or modules have a limited range of travel for placing the components, and therefore, the printed circuit board is typically processed in steps, each step placing a different portion of the printed circuit board within the range of the placement machine or module.

FIG. 1 illustrates a top view of an example assembly line of printed circuit boards 100 (100A, 100B, 100C, 100D, and 100E) and a component placement machine that includes eight component placement modules 150 (150A–150H). Each placement module 150 includes a feeder bar 160 that supplies components (not shown) to a movable head 170. The feeder bar 160 includes feeder slots 162 through which each component is supplied. The movable head 170 subsequently places the component at its appropriate location (x, y) on the printed circuit board 100 that is within its range. The movable head 170 travels in a latitudinal (y) direction on a movable bar 175 that moves in a longitudinal (x) direction to reach the appropriate location (x, y), and then moves in a vertical (z) direction (perpendicular to the view of FIG. 1) to place the component on the printed circuit board 100. The movable head 170 also rotates within the x-y plane, so that components may be placed in different orientations on the printed circuit board 100. After each of the placement modules 150 place their allocated components, the printed circuit boards 100 move a predetermined distance, traveling for example on a conveyor system 120. After moving the predetermined distance, the placement modules 150 place the next set of allocated components, the allocation being determined based upon the area of the printed circuit board 100 that is within the reach of each placement module 150.

As is commonly known in the art, the speed with which the component placement machine can populate each board 100 is a function of the particular components allocated to each particular placement module 150, and the order in which each placement module 150 obtains these selected components. Ideally, for example, one would want all of the placement modules to complete their placements of allocated components at exactly the same time at each step, thereby avoiding periods of inefficiency when only a few of the heads are being utilized. Other constraints also limit the speed of operation, or throughput, of the component placement machine. For example, the number and type of feeder slots 162 provided to each feeder 160 may limit the choice of components that may be allocated to a particular placement module.

The allocation of components to placement modules is a combinatorially complex problem having no known closed-form solution. Conventionally, the allocation is performed manually, or via the use of conventional programs based upon, for example, heuristics algorithms. U.S. Pat. No. 5,390,283, "Method for Optimizing the Configuration of a Pick and Place Machine", by Larry J. Eshelman and James D. Schaffer, issued Feb. 14, 1995, presents a method for determining a near-optimal allocation of components to placement modules through the use of an evolutionary algorithm, and is incorporated herein by reference. In that patent, as in the conventional method of component allocation, the step size is predetermined for a given placement machine, based upon the pitch of the printed circuit boards on the conveyor system. The pitch is defined as the distance from the start of one printed circuit board to the start of the next printed circuit board; it is the width of the printed circuit board plus the space between boards on the conveyor system. A stepping scheme for a printed circuit board with a pitch of 360 mm, for example, is presented in the referenced patent as a sequence of a 40 mm step followed by four 80 mm steps.

As discussed above, each step movement of the conveyor system determines the area of each printed circuit board that is within the reach of each placement module. As such, the choice of step movements will have a direct effect on the allocation options provided for each module, and therefore a direct effect on the speed of the component placement process. The choice of step movements, however, has a combinatorial effect on the allocation process, which is already a combinatorially complex problem. As such, the determination of a step movement that provides for optimal or near optimal throughput from the component placement machine does not currently have a closed form solution. For example, the aforementioned pitch of 360 mm could be processed as six steps of 60 mm each, rather than the steps of 40 mm followed by four 80 mm presented above. There will be, for example, a delay time associated with the starting, moving, and halting of the conveyor system for the additional sixth step, against which any gains of speed by different allocations must be weighed. In like manner, the pitch of 360 mm could be processed as nine 40 mm steps, three 120 mm steps, and so on. Even if the number of steps is the same, the choice of step size can affect the allocation; for example, a step of 80 mm followed by four steps of 70 mm might allow for a faster process than the aforementioned 40 mm followed by four 80 mm steps. Each choice of step sizes produces a substantially different set of options to the allocation process, dependent upon the relationships of the components being placed in the different areas within range of each movable head at each step.

BRIEF SUMMARY OF THE INVENTION

It is an object of this invention to provide a device or method for determining a preferred step movement sequence for a component placement machine. It is a further object of this invention to provide a preferred step movement sequence that optimizes the throughput of a component placement machine. It is a further object of this invention to provide a device or method for determining the preferred step size that does not require an exhaustive assessment of all possible step sizes.

These objects and others are achieved by representing the step size parameters as genes in a component placement chromosome, and applying evolutionary algorithm techniques to evolve offspring that have step size parameters that provide an improved component placement speed. The offspring that have these preferential step size parameters are used to generate additional offspring that provide further improvement in the component placement speed. After a number of generations, the step size parameters of the offspring that provides the best component placement speed are used to program the component placement machine to achieve an improved throughput.

BRIEF DESCRIPTION OF THE DRAWINGS

The invention is explained in further detail, and by way of example, with reference to the accompanying drawings wherein.

DETAILED DESCRIPTION OF THE INVENTION

Figure 1:
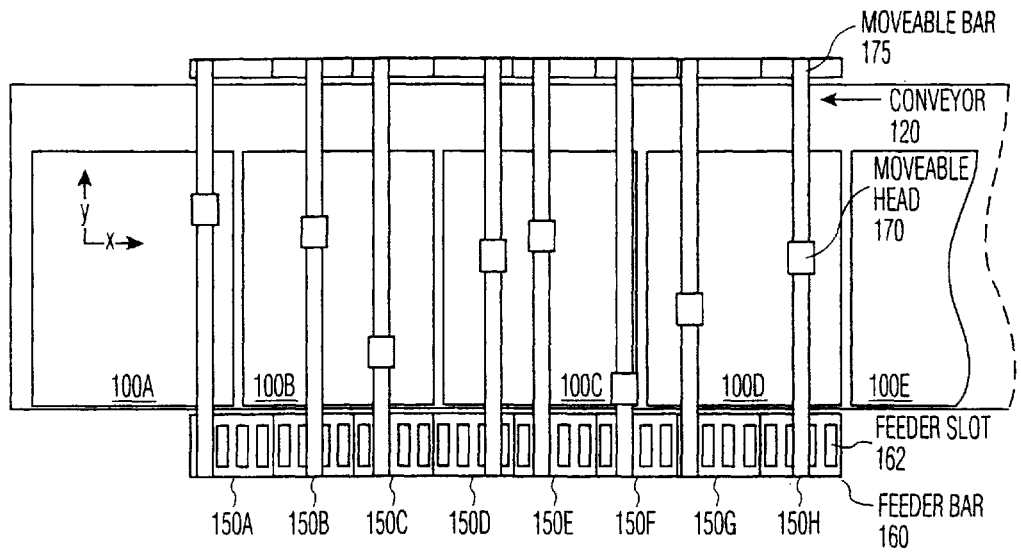
FIG. 1 illustrates an example component placement machine.
Figure 2:
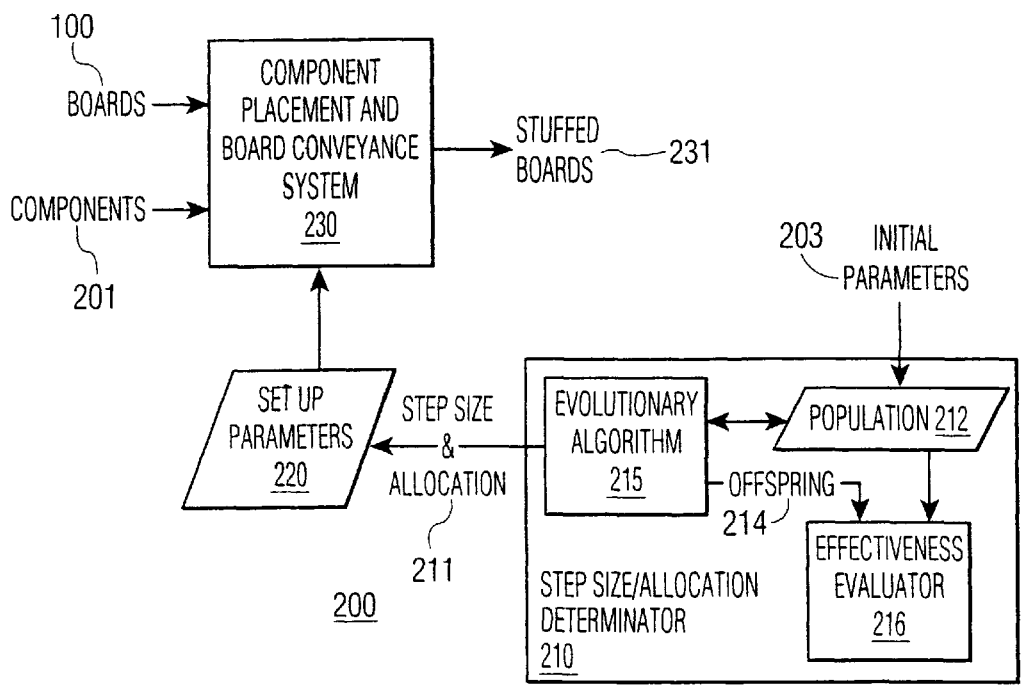
FIG. 2 illustrates an example component placement machine with a step size determinator in accordance with this invention.

FIG. 2 illustrates an example component placement machine 200 comprising a component placement and board conveyance system 230, and a step size and allocation determinator 210. The component placement and conveyance system 230 includes, for example, one or more component placement modules 150 and a conveyor 120, as illustrated in FIG. 1. The component placement and conveyance system 230 receives boards 100 and components 201 and places the components 201 at their designated locations on each board 100, thereby producing boards with components, commonly termed "stuffed" boards 231. The component placement and conveyance system 230 is programmed with set up parameters 220 that include, among other parameters, a set of step size and allocation parameters 211. In accordance with this invention, the step size and allocation determinator 210 determines the step size and allocation parameters 211 via an evolutionary algorithm 215. The evolutionary algorithm 215, discussed below, operates by generating offspring 214 from a population 212, and then selectively modifying the population 212 based upon the effectiveness of the offspring 214, as compared to existing members of the population 212. The members of the initial population 212 possess characteristics based on a set of initial parameters 203. An effectiveness evaluator 216 determines the effectiveness of the initial population 212, and each subsequent offspring 214. After repeated cycles of offspring generation, evaluation, and selective population modification, the most effective step size and allocation are selected as the preferred step size and allocation 211 that are provided as set up parameters 220 to the component placement and board conveyance system.

FIG. 3 illustrates an example of how the selected step size affects component allocations. For this example, it is assumed that two component placement modules 150 (150A, 150B of FIG. 1, not shown in FIG. 3) are available for placing components. Components allocated to the module 150A are labeled A01, A02, . . . , A14 in FIG. 3; components allocated to the module 150B are labeled B01, B02, . . . , B14. As is common in the art, typical component placement machines have constraints that may limit the type or size of component that may be placed by a particular module, as well as constraints that preclude the placement of components at the boundary of adjacent placement modules. The example of FIG. 3 is presented in an idealized form, without such constraints, for ease of illustration and understanding.

Figure 3A:
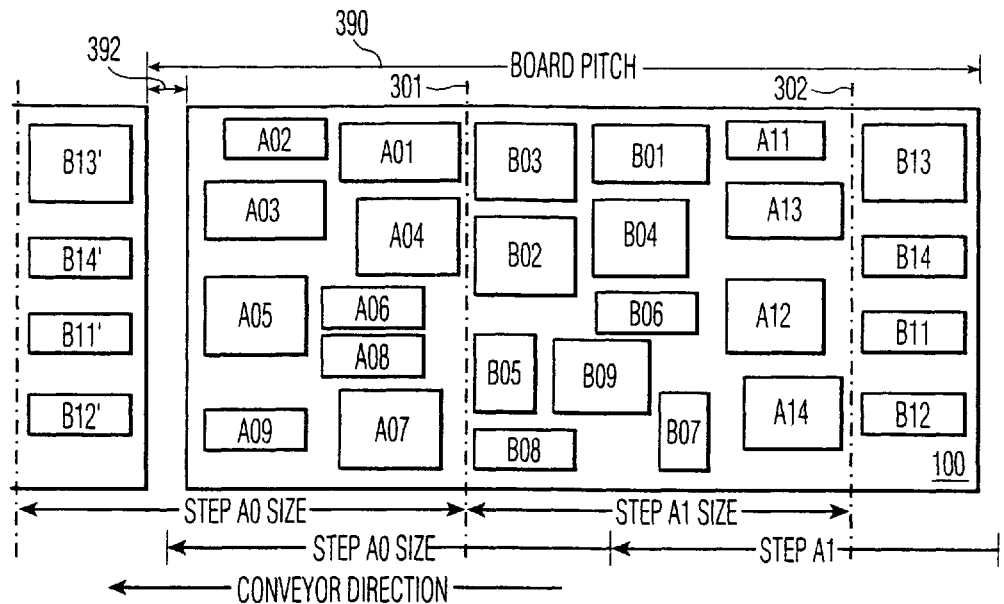
FIGS. 3A and 3B illustrate two example component allocations based on step size.
Figure 3B:
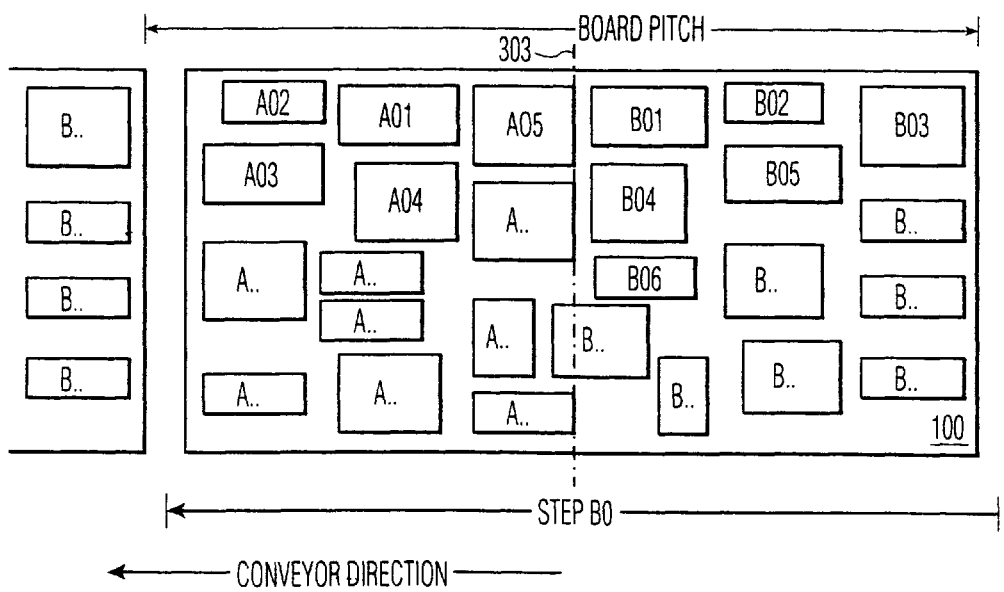

FIG. 3A illustrates an example allocation of components using a step size that is a fraction of the board pitch, and FIG. 3B illustrates an example allocation of components using a step size that is equal to the board pitch. The board pitch 390 is the width of the printed circuit board 100 plus the space between boards 392.

In FIG. 3A, the first step size AO is selected such that the first two columns of components to the left of the indicated line 301 are placed within the range of the module 150A, and the next two columns of components to the right of the indicated line 301 are placed within the range of the module 150B. For ease of understanding, all of the components within the range of each module 150A, 150B are assumed to be placeable by that module. As is common in the art, and as discussed in the referenced U.S. Pat. No. 5,390,283, due to a limitation in the number and size of feeder slots 162, not all components will be placable by each placement module 150. Also as is common in the art, each module 150 may have clearance or interference constraints that limit the ability of adjacent modules to place components in adjacent areas. A typical component placement machine may have eight or more placement modules 150, with which these limitations can be overcome. If, for example, components A01 and A04 can not be placed by module 150A because of their proximity to the components B03 and B02 that are placed by module 150B, or because of some other constraint, another module, such as 150E in FIG. 1 can be used to place components A01 and A04 when the printed circuit board 100 is conveyed to the appropriate position within the range of module 150E.

The placement module 150A places the components A01–A09 on the printed circuit board 100 at their designated locations at the same time that the placement module 150B places the components B01–B09 at their designated locations. After both placement modules complete these placements, the printed circuit board 100 is conveyed a step size A1, so as to place one of the two remaining columns of components within range of placement module 150A and the other column, to the right of the indicated line 302, within range of placement module 150B. Thereafter, the placement module 150A places the components A11–A14 at the same time that placement module 150B places the components B11–B14. After both placement modules complete these placements, the printed circuit board 100 is conveyed a step size A0, and the next board on the conveyor system is similarly processed.

The processing time for the board illustrated in FIG. 3A can be seen to be the sum of:

the time required to move the conveyor by step size A0;
the larger of:
  the time required for module 150A to place components A01–A09, or
  the time required for module 150B to place components B01–B09;
the time required to move the conveyor by step size A1; and
the larger of:

the time required for module 150A to place components A11–A14, or the time required for module 150B to place components B11–B14.

Based primarily upon the speed of the feeding process, the speed of the transport process, and the location and orientation of each component on the board relative to the assigned module at each of the two stopped locations corresponding to indicated lines 301, 302, the time required for each module 150A, 150B to place their allocated components at each stopped location can be estimated. In like manner, based upon the inertial characteristics of the conveyance system, the time required to move the conveyor each step size A0, A1 can be estimated. Other factors, such as the order in which the components are selected and placed may also affect the processing time, as is common in the art.

FIG. 3B illustrates the same printed circuit board 100, but processed with a single step B0. The single step is selected such that the components to the left of the indicated line 303 are placed by the placement module 150A, and the other components are placed by the placement module 150B. The components illustrated with an A prefix in FIG. 3B indicate those that are allocated to the placement module 150A based upon this single step B0, and those illustrated with a B prefix in FIG. 3B indicate those that are allocated to the placement module 150B. As can be seen, the allocation of FIG. 3B differs from that of FIG. 3A, due to the change in step size.

The processing time for the board illustrated in FIG. 3B can be seen to be the sum of:

the time required to move the conveyor by step size B0;

the larger of:

the time required for module 150A to place the A-prefixed components, or the time required for module 150B to place the B-prefixed components.

Note that although the processing time is simpler to express for FIG. 3B, it is not necessarily certain that the overall processing time for the allocation of FIG. 3B is less than that for the allocation of FIG. 3A. For example, the transport time for the movable bar 175 over long distances may be greater than that of the conveyance system, such that providing two areas of limited range for each module 150 results in a faster overall process than that which can be achieved by providing one area of extended range to each module 150. These and other factors make the selection of an optimal step size an exponentially complex process. Conventionally, the selection of step size is made based upon heuristics, such as that presented in the referenced U.S. Pat. No. 5,390,283. wherein the use of a generally usable large step size (80 mm in the example given) is preferred, to minimize the number of steps and the delays associated with starting and stopping the conveyance system.

An alternative to a heuristic rule is a solution based upon a trial and error search for an optimal or near optimal step size. A random trial and error solution, however, is not necessarily efficient or effective. In accordance with this invention, a directed trial and error search is presented, based upon the use of an evolutionary algorithm. Evolutionary algorithms operate via an iterative offspring production process. Evolutionary algorithms include genetic algorithms, mutation algorithms, and the like. In a typical evolutionary algorithm, certain attributes, or genes, are assumed to be related to an ability to perform a given task, different combinations of genes resulting in different levels of effectiveness for performing that task. The evolutionary algorithm is particularly effective for problems wherein the relation between the combination of attributes and the effectiveness for performing the task does not have a closed form solution.

The offspring production process is used to determine a particular combination of genes that is most effective for performing a given task, using a directed trial and error search. A combination of genes, or attributes, is termed a chromosome. In the genetic algorithm class of evolutionary algorithms, a reproduction-recombination cycle is used to propagate generations of offspring. Members of a population having different chromosomes mate and generate offspring. These offspring have attributes passed down from the parent members, typically as some random combination of genes from each parent. In a classic genetic algorithm, the individuals that are more effective than others in performing the given task are provided a higher opportunity to mate and generate offspring. That is, the individuals having preferred chromosomes are given a higher opportunity to generate offspring, in the hope that the offspring will inherit whichever genes allowed the parents to perform the given task effectively. The next generation of parents are selected based on a preference for those exhibiting effectiveness for performing the given task. In this manner, the number of offspring having attributes that are effective for performing the given task will tend to increase with each generation. Paradigms of other methods of generating offspring, such as asexual reproduction, mutation, and the like, are also used to produce generations of offspring having an increasing likelihood of improved abilities to perform the given task.

In the context of this disclosure, the population consists of members having chromosomes that reflect different combinations of step size and associated component allocation. Some combinations of abilities for step size and associated component allocation are more effective for speed of component placement than other combinations. In accordance with this invention, by generating offspring from the members having chromosomes that are more effective for component placement than others, the effectiveness of the offspring for efficient component placement is likely to increase.

A multitude of evolutionary algorithms are available that may be employed in accordance with this invention. The CHC Adaptive Search Algorithm has been found to be particularly effective for complex combinatorial engineering tasks. As compared to other evolutionary algorithms, the CHC algorithm is a genetic algorithm that employs a "survival of the fittest" selection, wherein only the better performing individuals, whether parent or offspring, are used to generate subsequent offspring. To counteract the adverse genealogical effects that such selective survival can introduce, the CHC algorithm avoids incestuous matings, matings between individuals having very similar attributes. As would be evident to one of ordinary skill in the art, each evolutionary algorithm exhibits pros and cons with respect to the schema used to effect an iterative solution, and the particular choice of evolutionary algorithm for use in this invention is optional. For clarity and ease of understanding, the details of this invention are presented using techniques common to the CHC algorithm, although the use of other evolutionary algorithms would be evident to one of ordinary skill in the art in the context of this disclosure.

Figure 4:
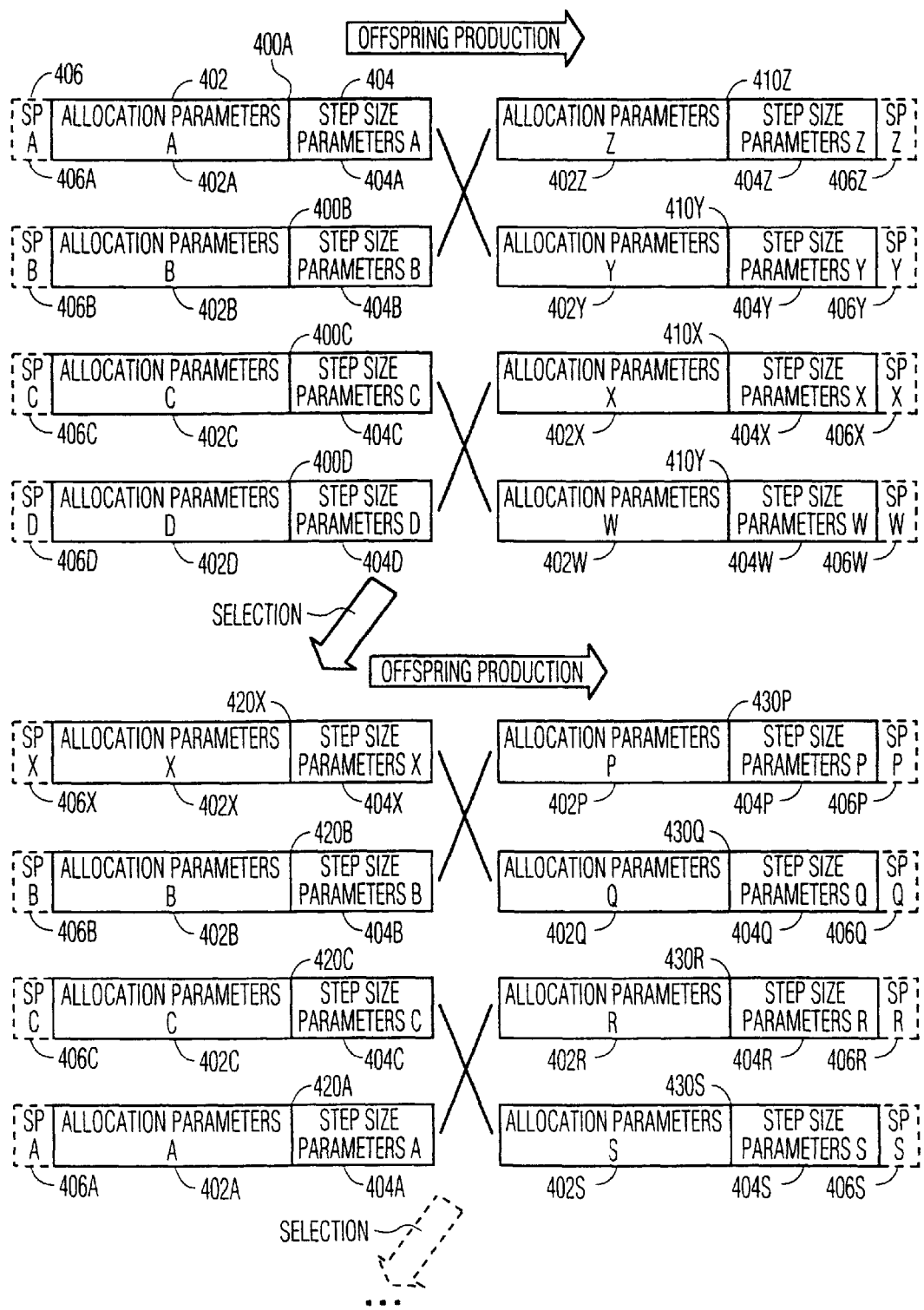
FIG. 4 illustrates an example evolution of a preferred step size based on an evolutionary algorithm in accordance with this invention.

FIG. 4 illustrates an example generation of offspring via the CHC algorithm. Illustrated at the upper left of FIG. 4 are four example parents 400A, 400B, 400C, and 400D. Each parent 400 has a set of allocation parameters 402 and step size parameters 404; these parameters 402, 404 result in an estimated speed of placement Sp A, Sp B, Sp C, Sp D, illustrated by the dashed box 406A–406D associated with each parent. Parents 400A and 400B are mated to produce offspring 410Z and 410Y, whose allocation parameters 402Z, 402Y and step size parameters 404Z, 404Y are inherited based on a combination of the allocation parameters 402A, 402B and step size parameters 404A, 404B of their parents 400A and 400B. These inherited allocation parameters 402Z, 402Y and step size parameters 404Z, 404Y of offspring 410Z and 410Y result in a placement speed of Sp Z and Sp Y respectively 406Z, 406Y. In like manner, parents 400C and 400D are mated to produce offspring 410X and 410W, whose inherited allocation parameters 402X, 402W and step size parameters 404X, 404W result in a placement speed of Sp X and Sp W, respectively 406X 406W.

In the selection phase, four parents 420 for the next generation are selected from the parents 400 and offspring 410 of the prior generation. In accordance with this invention, the next generation parents are selected based upon the speed of placement associated with each of the members of the prior generation. Using the "survival of the fittest" criteria of the CHC algorithm, the four members having the best speed of placement 406 are selected as parents 420 for the next generation. In the example illustrated in FIG. 4, members 400A, 400B, 400C, and 410X have better speed of performance Sp A, Sp B, Sp C, and Sp X 406 than the other members 400D, 410W, 410Y, and 410Z, and are selected as parents 420X, 420B, 420C, and 420A for the next generation.

Parents 420X and 420B are mated to produce offspring 430P and 430Q, and parents 420C and 420A are mated to produce offspring 430R and 430S. As above, the offspring 430 inherit allocation parameters 402 and step size parameters 404 based on their parents parameters 402, 404. The parameters 402, 404 of each of the offspring 420P, 420Q, 420R, and 420S result in a placement speed 406 of Sp P, Sp Q, Sp R, and Sp S, respectively.

Based on the placement speeds 406 of each of the eight members 420A, 420B, 420C, 420X 430P, 430Q, 430R, and 430S, the four parents of the next generation are selected. Because the selection of each generation's parents include the selection of the best performing members from the prior generation's parents and offspring, the selection is guaranteed to include the member having the best speed of placement found thus far; therefore the CHC algorithm is at least as good as a random trial and error. Because each generation's parameters are based upon the best of the prior generation, the likelihood of finding better performing members is greater than that of a random trial and error process.

The evolutionary process continues, generating offspring from the better performing members of each prior set of parent and offspring, until the process converges to a preferred best performing member, or until a specified time limit is exceeded. Optionally, the entire evolutionary process can be restarted, using a mutation of the set of better performing members or other mutation strategy, to avoid the likelihood of an initial convergence to a sub-optimal solution. In a preferred embodiment, the best performing member is retained, non-mutated, in each of the restart processes, if any. In this manner, each restarted process is guaranteed to produce the same or better result than each of the prior processes.

As is common in the art of evolutionary algorithms, different encodings may be used to encode the chromosomes with the parameters of interest. In a preferred embodiment, the step size parameters are encoded as binary numbers representing the step size(s). In a straightforward embodiment, for example, a single three bit number is used to represent the step size, as multiples of 10 mm, thereby representing a step size of 10, 20, 30, 40, 50, 60, 70, or 80 mm. The board pitch is spanned using repeated steps of the encoded size, followed by a final step, if required, that is equal to the board pitch minus the sum of the multiple step sizes. For a greater precision in step size, additional bits may be allocated to encode the step size. In an alternative embodiment, the encoding represents the number of steps, rather than the size. The size of each step is determined as the board pitch divided by the number of steps. In another alternative embodiment, a default step size is provided, and the encoding represents positive and negative deviations from this default setting. Note that the aforementioned encodings are based on a premise of relatively uniform step sizes.

Figure 5:
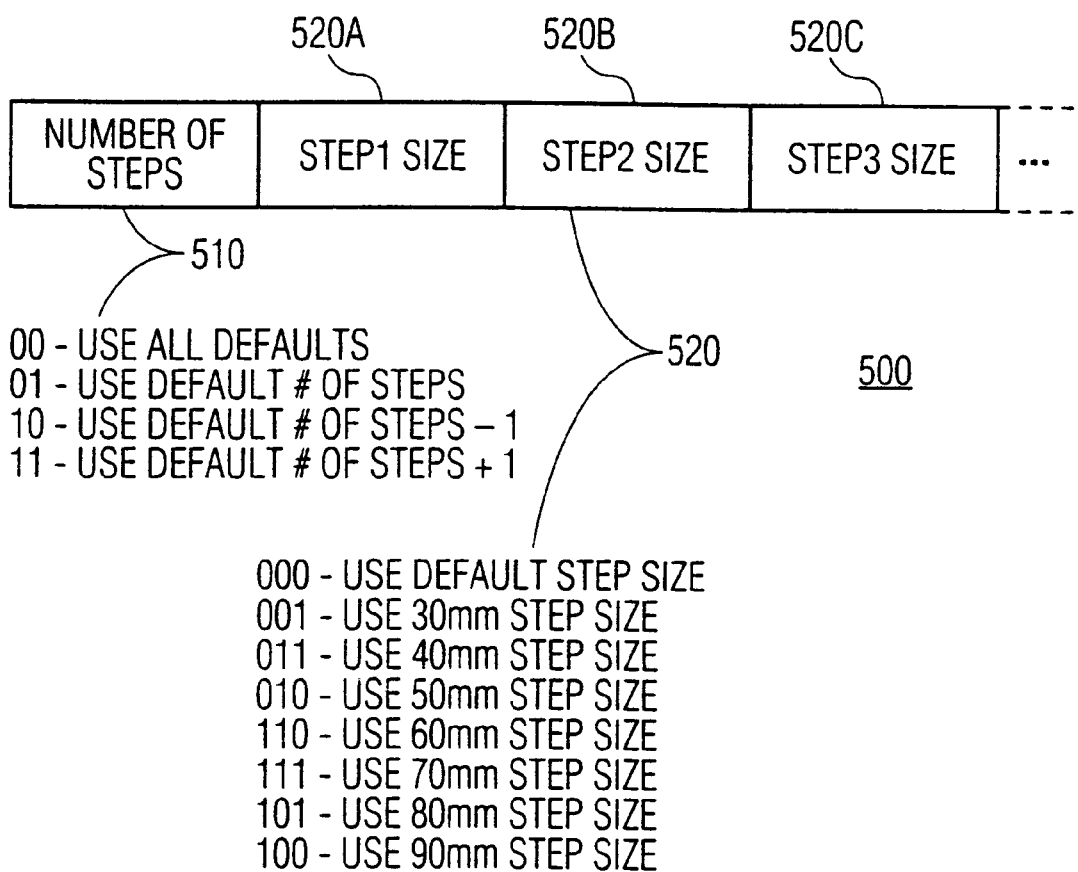
FIG. 5 illustrates an example chromosome encoding of step size parameters based on an evolutionary algorithm in accordance with this invention.

FIG. 5 illustrates an example preferred encoding of a chromosome 500 that allows for a varying number of steps 510, and non uniform step sizes 520A, 520B, 520C, etc., individual encodings are used to represent each of the individual step sizes. In this embodiment, two bits are used to represent four combinations of the number of steps. A 00 encoding represents the use of the default number of steps and step sizes for the given board pitch. That is, if a member has a 00 encoding in the number of steps field, the evolutionary algorithm will use, for example, the step size parameters presented in the referenced U.S. Pat. No. 5,390,283. A 01 encoding represents the use of the default number of steps, wherein the size of each step is encoded in the subsequent step size fields 520. A 10 encoding represents the use of one fewer number of steps from the default; a 11 encoding represents one additional number of steps from the default.

Typically, chromosomes have a fixed length; therefore, genes are allocated to be sufficient to encode the maximum number of step sizes. If M is the maximum number of steps, M−1 step size fields 520 are required, the last step size being constrained to be the board pitch minus the sum of the M−1 step sizes. In the embodiment of FIG. 5, the maximum number of steps is the default number of steps (D) plus one, or M=(D+1); therefore space is allocated in the chromosome to accommodate D step sizes. As illustrated in FIG. 5, a gray-code encoding is used to encode a variety of step sizes for each of the steps 520A, 520B, 520C, etc. If the number of steps encoding is a 00, indicating the use of default step sizes, the contents of each of these fields is ignored. Similarly, if the number of steps is X, the encoding of step sizes beyond X−1 is ignored. As discussed above, the number of bits allocated to each field determines the number of options available, and hence the resolution of the step sizes. If additional step size options or number of step options is desired, additional bits are used, with a corresponding increase in storage and processing requirements for these additional options.

Using the bit level representation for the step size parameters, a mating between two parents is effected by randomly switching those bits of the parents that differ. For example, if one parent has an encoding of 0100, and the other has an encoding of 1101, the first and last bits are randomly switched to produce the offspring. That is, the middle two bits of each offspring will be 10, because both of the parents have 10 as their middle two bits. One of the offspring will have a 0 as a first bit, and the other will have a 1 as the first bit. One of the offspring will have a 0 as a last bit and the other will have a 1 as the last bit. Which offspring assumes which first and last bit value is randomly determined. That is, in this example, the offspring will have values of (0100 and 1101), (1100 and 0101), (1101 and 0100), or (0101 and 1100). Consistent with the principles of evolutionary algorithms, if both parents have preferential characteristics, and their commonalty is their middle two genes, it is somewhat likely that this particular bit value accounts for their preferential characteristics. Passing these common genes to their offspring limits the generation to genes that are "close" to these parents in the search space. In a preferred embodiment, a gray code binary encoding is used to encode the step size parameters, wherein adjacent step size values differ by only one bit in their encoding. Because the parents are selected based on their preferential characteristics, the evaluation of alternatives that are close to the parents is more likely to locate an alternative that is better than the parents than a randomly selected alternative encoding. If, on the other hand, other parents and offspring provide a more effective component placement, this set of characteristics (10 in the middle two bits) will "die out" when the parents and offspring having this set of characteristics are not selected as future generation parents. In this manner, the likelihood of selecting ineffective alternatives is reduced, compared to a random selection process.

A preferred encoding of allocation parameters is presented in the reference U.S. Pat. No. 5,390,283. Although an evolutionary algorithm encoding of the allocation parameters is preferred, so that the off-spring of each generation are evaluated and assessed based on both the allocation and the step size, alternative techniques are also consistent with this invention. For example, a conventional allocation of components may be performed based on the determined step size. That is, the evolutionary algorithm may be applied to determine the optimal step size using conventional allocation techniques. In a preferred embodiment that uses conventional allocation techniques, an evolutionary algorithm is used to determine the preferred number of steps and the individual step sizes, as discussed above. This embodiment is particularly well suited for a printed circuit board that has some regions that are sparsely populated with components, and other regions with a higher component density.

Figure 6:
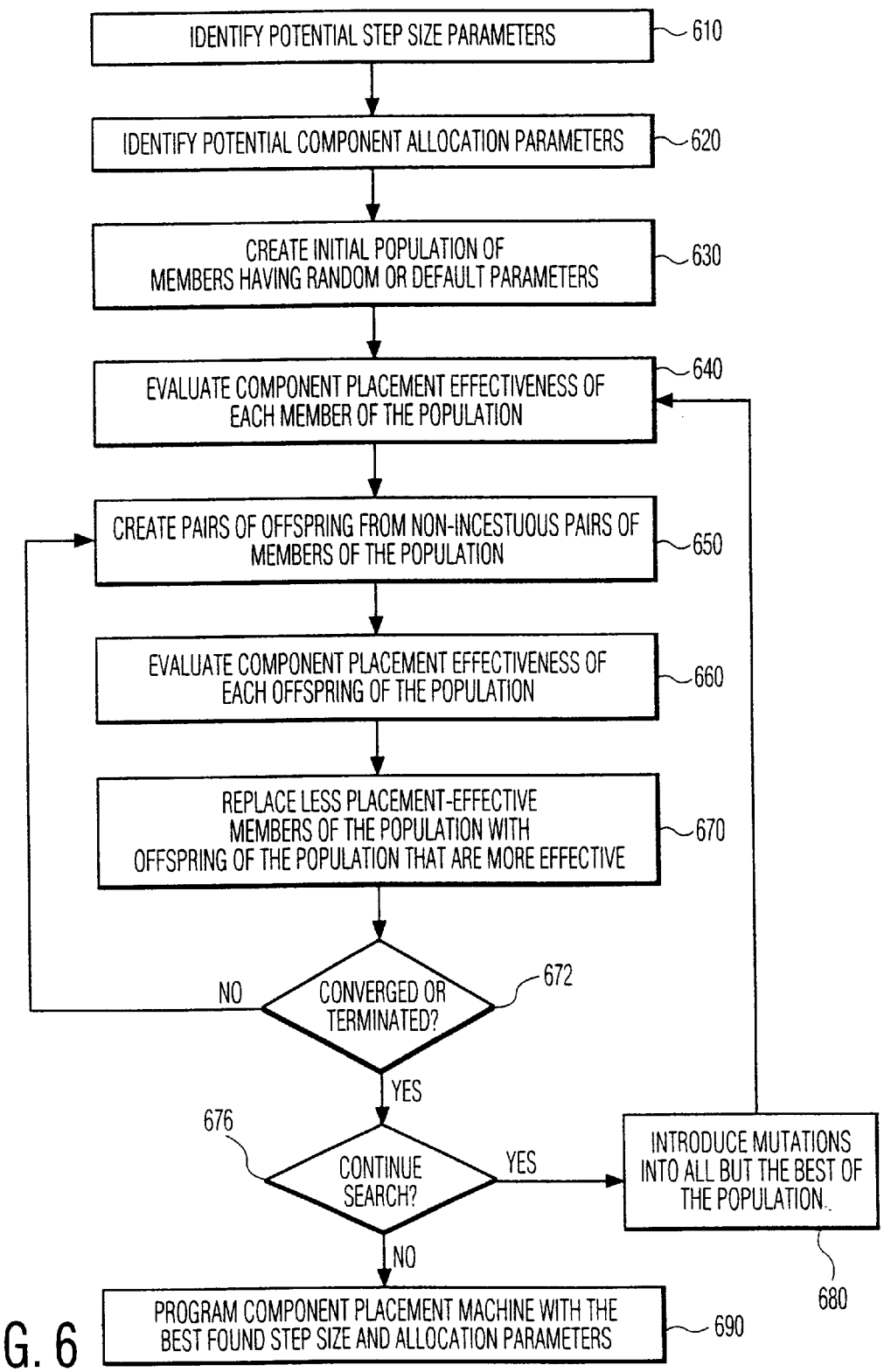
FIG. 6 illustrates an example flow chart for determining a preferred step size in accordance with this invention.

FIG. 6 illustrates an example flow diagram for the evolutionary generation of step size parameters to optimize the component placement effectiveness. At 610, the potential step sizes are identified, based on the given board pitch and the capabilities of the component placement machine. In like manner, at 620, the potential allocation parameters are determined based upon the components that are to be placed on the board and the capabilities of the component placement machine. For example, given a particular board with associated set of components, the range of feasible step sizes may be determined at 610, and the number of possible feeder slots may be determined at 620. Defining constraints on step size and allocation parameters are tasks that are common to one of ordinary skill in the art of setting up component placement machines. At 630, parameters within the bounds set in 610 and 620 are encoded as chromosomes of an initial population. These parameters may be randomly generated or supplied as default values, using for example, existing heuristic rules. For example, a step size that is an integer factor of the board pitch may be specified as the step size for one or more of the initial members of the population, to provide a uniformity of steps, and a step size that is the maximum allowable for the component placement machine may be specified as the step size for other members, to provide a minimum number of steps. If these initial heuristic parameters are correct, the process will converge sooner; if the initial heuristic parameters are incorrect, they will "die out" when recombinations of these parameters are evaluated in subsequent generations.

At 640, the effectiveness of using the encoded parameter values for component placement is determined. As stated above, the common effectiveness measure for component placement is the throughput of the component placement machine, and is measured by the estimated time for component placement per printed circuit board. Other measures, such as load balancing for equal wear and tear per placement module, are common in the art and may be used in addition to, or in lieu of, the speed of placement measure. The loop 650–680 performs the evolutionary process, with an inner loop 650–672 and an optional outer loop 650–680. At 650, offspring are generated from the current members of the population. In a preferred embodiment, the CHC algorithm is used. Parents having maximum diversity are selected to generate a pair of offspring, and each of the offspring is evaluated, at 660, using the same measure of effectiveness that was used for the original members at 640. The selection of the next generation of parents is effected at 670. Any offspring that has a better measure of effectiveness than one of any of the parents replaces that parent, and becomes a parent in the next generation, as the program loops back to 650 to generate new offspring. If, at 672, the process has converged, or the process is terminated by, for example, a time-out signal, or a user interrupt, the inner loop 650–672 of the evolutionary process ceases. Optionally, at 676, the entire process may be repeated via the outer loop 650–680, to search along a new evolutionary path. In a preferred embodiment, mutations are introduced to all remaining members except the best performing member, and the entire process is repeated, via 640.

When the search is terminated, at 676, the best performing member of the remaining members is selected as the best solution found, at 690. The encoded parameters of the best performing member are decoded and used to program the component placement machine to effect these parameters. That is, for example, the bit pattern representing one or more step sizes is decoded and translated into whatever form the component placement machine requires to effect these one or more step sizes.

The foregoing merely illustrates the principles of the invention. It will thus be appreciated that those skilled in the art will be able to devise various arrangements which, although not explicitly described or shown herein, embody the principles of the invention and are thus within its spirit and scope. For example, although the invention is particularly well suited for a multi-module placement machine, the principles can be applied to a single placement module machine, wherein at each step size, the board is conveyed to place the next region of the board within the range of the single placement module. The particular structures and processes presented in the figures are presented for illustrative purposes; alternative structures and processes will be evident to one of ordinary skill in the art. For example, although the invention is well suited to printed circuit board component placement, other applications that employ discrete step processes whose efficiencies are dependent upon the selected step size may benefit from this invention, and are within the intended scope of the following claims.

I claim:

1. A component placement machine comprising:
   a placement module having an allocation of components, and
   a conveyor that moves a board relative to the placement module a predetermined step size to facilitate placement of the components on the board by the placement module, wherein,
   the allocation of components is dependent upon the predetermined step size, and the predetermined step size is determined by an evolutionary algorithm to facilitate an optimization of the allocation.

2. The component placement machine of claim 1, wherein
the component placement machine processes the board at a throughput rate, and
the optimization of the allocation is based upon the throughput rate.

3. The component placement machine of claim 1, wherein the evolutionary algorithm is a CHC adaptive search algorithm.

4. The component placement machine of claim 1, wherein the step size is encoded in the evolutionary algorithm as a grey code binary pattern.

5. The component placement machine of claim 1, further comprising
a step size determinator that includes:
an evolutionary algorithm device that effects the evolutionary algorithm and generates at least one offspring from at least one parent, and
an effectiveness evaluator that provides an effectiveness measure associated with the at least one offspring,
wherein the at least one offspring is selected for subsequent offspring generation by the evolutionary algorithm device, based on the effectiveness measure.

6. A computer readable medium comprising a computer program for determining a preferred step size that includes:
an evolutionary algorithm that generates a plurality of offspring from a plurality of parents, each of the plurality of parents having step size parameters and each of the plurality of offspring inheriting step size parameters that are based on the step size parameters of at least one parent of the plurality of parents,
an effectiveness evaluator that provides an effectiveness measures associated with each parent of the plurality of parents and with each offspring of the plurality of offspring, wherein:
the evolutionary algorithm selects at least one offspring for subsequent offspring generation, based on the effectiveness measure of the at least one offspring, and
the evolutionary algorithm determines a preferred member from the plurality of parents and the plurality of offspring, based on the effectiveness measure associated with each parent of the plurality of parents and with each offspring of the plurality of offspring, and determines therefrom the preferred step size, based on step size parameters associated with the preferred member.

7. The computer readable medium of claim 6, wherein each of the plurality of parents and each of the plurality of offspring also possess component allocation parameters, and the evolutionary algorithm determines an allocation of components based on the component allocation parameters of the preferred member.

8. A method for determining a preferred step size for a process having an effectiveness that depends upon the preferred step size, including the steps of:
encoding a plurality of sample step sizes as attributes of a plurality of members,
evaluating a measure of effectiveness for each member of the plurality of members, based on the attributes of each member,
generating a plurality of offspring, such that each of the plurality of offspring have attributes that are based on the attributes of the plurality of members,
evaluating a measure of effectiveness for each offspring of the plurality of offspring,
replacing at least one member of the plurality of members by at least one offspring of the plurality of offspring, based on the measure of effectiveness of the at least one member and the measure of effectiveness of the at least one offspring, and
determining the preferred step size based on the attributes of a select one of the plurality of members.

9. The method of claim 8, wherein the process is a component placement process for a printed circuit board, and the measure of effectiveness includes a speed of component placement on the printed circuit board.

10. The method of claim 8, wherein the encoding of the plurality of sample step sizes is via a gray code binary pattern.

11. The method of claim 8, wherein the replacing of the at least one member is based upon a survival of the fittest technique.

* * * * *